(12) United States Patent
Ise et al.

(10) Patent No.: US 8,856,474 B2
(45) Date of Patent: Oct. 7, 2014

(54) NONVOLATILE MEMORY UNIT WITH SECURE ERASING FUNCTION

(75) Inventors: Masahiro Ise, Kawasaki (JP); Michiyo Garbe, Kawasaki (JP); Jin Abe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 217 days.

(21) Appl. No.: 13/224,710

(22) Filed: Sep. 2, 2011

(65) Prior Publication Data

US 2012/0084526 A1 Apr. 5, 2012

(30) Foreign Application Priority Data

Sep. 30, 2010 (JP) .................................. 2010-223225

(51) Int. Cl.
| | | |
|---|---|---|
| *G06F 12/00* | (2006.01) | |
| *G11C 16/30* | (2006.01) | |
| *G11C 16/16* | (2006.01) | |
| *G06F 12/02* | (2006.01) | |

(52) U.S. Cl.
CPC .............. *G11C 16/16* (2013.01); *G11C 16/30* (2013.01); *G06F 2212/7204* (2013.01); *G06F 2212/7205* (2013.01); *G06F 12/0246* (2013.01)
USPC ................... 711/164; 711/3; 711/4; 711/166; 711/E12.002; 711/E12.091

(58) Field of Classification Search
USPC ........... 711/3, 4, 164, 166, E12.002, E12.091
See application file for complete search history.

(56) References Cited

U.S. PATENT DOCUMENTS

| 5,771,191 A | * | 6/1998 | Matsue ..................... 365/185.09 |
|---|---|---|---|
| 5,798,968 A | * | 8/1998 | Lee et al. .................. 365/185.29 |
| 5,884,055 A | * | 3/1999 | Tung et al. ..................... 710/307 |
| 2008/0052549 A1 | * | 2/2008 | Ichien et al. .................. 713/322 |
| 2008/0301817 A1 | * | 12/2008 | Yoshida et al. .................. 726/26 |

FOREIGN PATENT DOCUMENTS

JP        2010-176398        8/2010

* cited by examiner

*Primary Examiner* — Mardochee Chery
(74) *Attorney, Agent, or Firm* — Staas & Halsey LLP (57) ABSTRACT

An apparatus includes a nonvolatile memory, an interface that at least receives an erase command of the nonvolatile memory, a first controller that controls the nonvolatile memory to execute data erasing on the basis of the erase command output from the interface, an external input unit which is installed independently of the interface, a second controller that controls the nonvolatile memory to execute data erasing on the basis of an erase instruction signal output from the external input unit, and a change-over circuit that switches between connection of the first controller with the nonvolatile memory and connection of the second controller with the nonvolatile memory, wherein the second controller controls the nonvolatile memory to execute data erasing on the basis of the erase instruction when the connection of the second controller with the nonvolatile memory is established by the change-over circuit.

16 Claims, 9 Drawing Sheets

NONVOLATILE MEMORY UNIT WITH SECURE ERASING FUNCTION

CROSS-REFERENCE TO RELATED APPLICATION

This application is based upon and claims the benefit of priority of the prior Japanese Patent Application No. 2010-223225, filed on Sep. 30, 2010, the entire contents of which are incorporated herein by reference.

FIELD

The embodiments discussed herein are related to a nonvolatile memory unit.

BACKGROUND

In recently years, an SSD (Solid State Drive) that uses a nonvolatile memory unit such as a flash memory in place of an HDD (Hard Disk Drive) as a storage device of information equipment such as a personal computer attracts notice. Utilization of the SSD as a file system of a personal computer (PC) is now being increased.

Much personal information and user data of a user of a PC is recorded in a file system of the type as mentioned above and seriousness of leakage of information recorded in the file system has been increased to such an extent that it causes social problems. Accordingly, in the case that a nonvolatile memory unit is to be discarded, it may be unavoidable to erase data in a nonvolatile memory which is mounted on the nonvolatile memory unit.

Therefore, an erase command is input into an interface from the outside in order to erase data in the nonvolatile memory concerned and a nonvolatile memory controller controls the nonvolatile memory to erase the data in it on the basis of the erase command. Thus, it may be unavoidable to use data erasing equipment that includes an interface which is allowed to issue the erase command when the data in the nonvolatile memory is to be erased.

However, in the case that the nonvolatile memory controller is failed, it may be difficult to erase the data in the nonvolatile memory regardless of use of the data erasing equipment. Therefore, secret data such as personal information and the like may be left in the nonvolatile memory unit.

In a failed nonvolatile memory unit, it may be possible to read out data in the nonvolatile memory by replacing a failed nonvolatile memory controller included in the memory unit with a new one. In addition, it may be also possible to read out the data by detaching the nonvolatile memory mounted on the memory unit from the unit and gaining access to the detached nonvolatile memory.

Thus, discarding the failed nonvolatile memory unit as it is may lead to information leakage. Therefore, in general, the failed nonvolatile memory unit is physically destroyed by punching it or by taking other measures. However, any sufficient result may not be obtained unless all nonvolatile memories mounted on the failed nonvolatile memory unit are physically destroyed. Therefore, it is expected to favorably destroy the memories.

However, the number of nonvolatile memories mounted on the nonvolatile memory unit is increased with an increase in storage capacity of late years. As a result, much time is taken to destroy all the nonvolatile memories included in the memory unit and the processing man-hour is increased accordingly.

SUMMARY

According to an aspect of the invention, an apparatus includes a nonvolatile memory, an interface that at least receives an erase command to the nonvolatile memory unit, a first controller that controls the nonvolatile memory to execute data erasing on the basis of the erase command output from the interface, an external input unit which is installed independently of the interface, a second controller that controls the nonvolatile memory to execute data erasing on the basis of an erase instruction signal output from the external input unit, and a change-over circuit that switches between connection of the first controller with the nonvolatile memory and connection of the second controller with the nonvolatile memory, wherein the second controller controls the nonvolatile memory to execute data erasing on the basis of the erase instruction when the connection of the second controller with the nonvolatile memory is established by the change-over circuit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
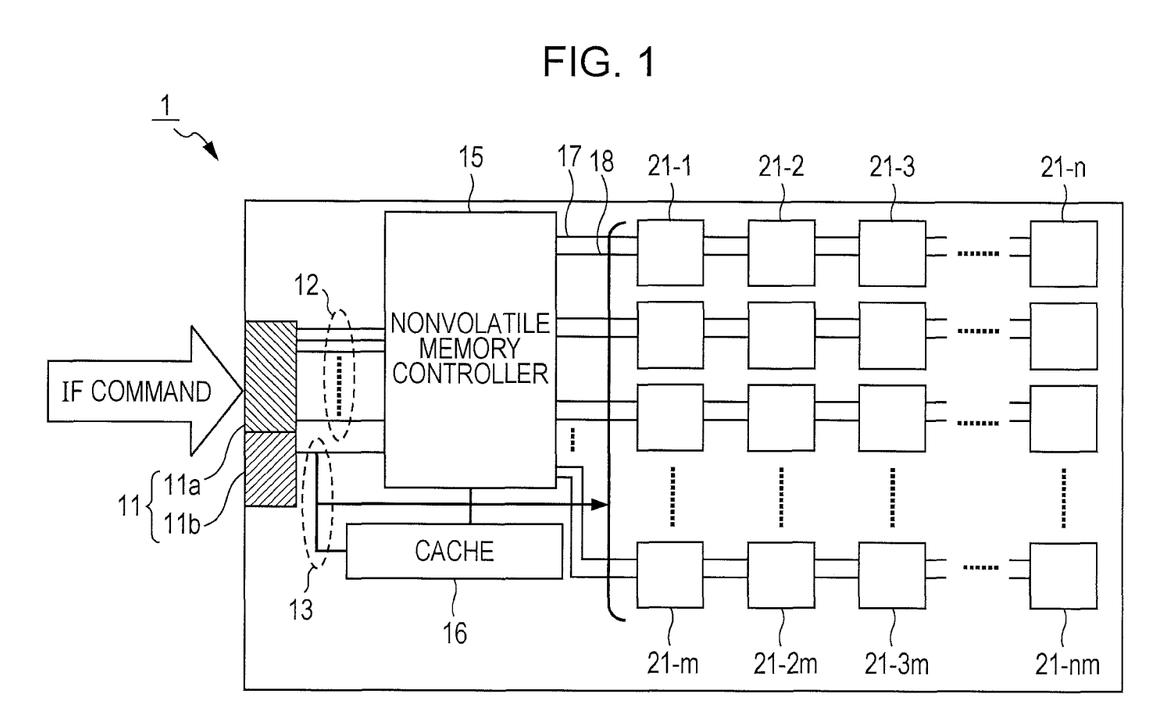
FIG. 1 is a diagram illustrating an example of a configuration of a nonvolatile memory unit according to a comparative example.

Next, preferred embodiments will be described in detail with reference to the accompanying drawings. FIG. 1 is a diagram illustrating an example of a configuration of a nonvolatile memory unit according to a comparative example. A nonvolatile memory unit 1 includes an interface 11 which is connected with a personal computer as a host, a nonvolatile memory controller 15, a cache memory 16, and a plurality of nonvolatile memories 21-1 to 21-*nm*.

The interface 11 is an interface such as a fiber channel (FC). The interface 11 includes a signal input unit 11a that at least receives an interface command (IF command) and a power supply input unit 11b into which the power is supplied. The IF command is input into the nonvolatile memory controller 15 via a signal line 12.

The nonvolatile memory controller 15 controls operations such as data recording, data regenerating and data erasing executed on the nonvolatile memories 21-1 to 21-nm on the basis of the IF command. Then, the nonvolatile memory controller 15 sends the nonvolatile memories 21-1 to 21-nm control signals such as a command signal and an address select signal via a control signal line 18 and inputs data into the memories and outputs data from the memories via an I/O bus 17.

The cache memory 16 is used as a temporal storage area of recorded and regenerated data, a storage area of a program of the nonvolatile memory controller 15 and the like. The power which has been input into the power supply input unit 11b of the interface 11 is supplied to the nonvolatile memory controller 15, the nonvolatile memories 21-1 to 21-nm, the cache memory 16 and the like via a power supply line 13.

The nonvolatile memories 21-1 to 21-nm are arranged in a matrix of n rows and m columns, that is, n×m (n and m are integers) nonvolatile memories are installed in total. Incidentally, the number of nonvolatile memories may be one. As an example of the nonvolatile memory, a flash memory is used.

Figure 2:
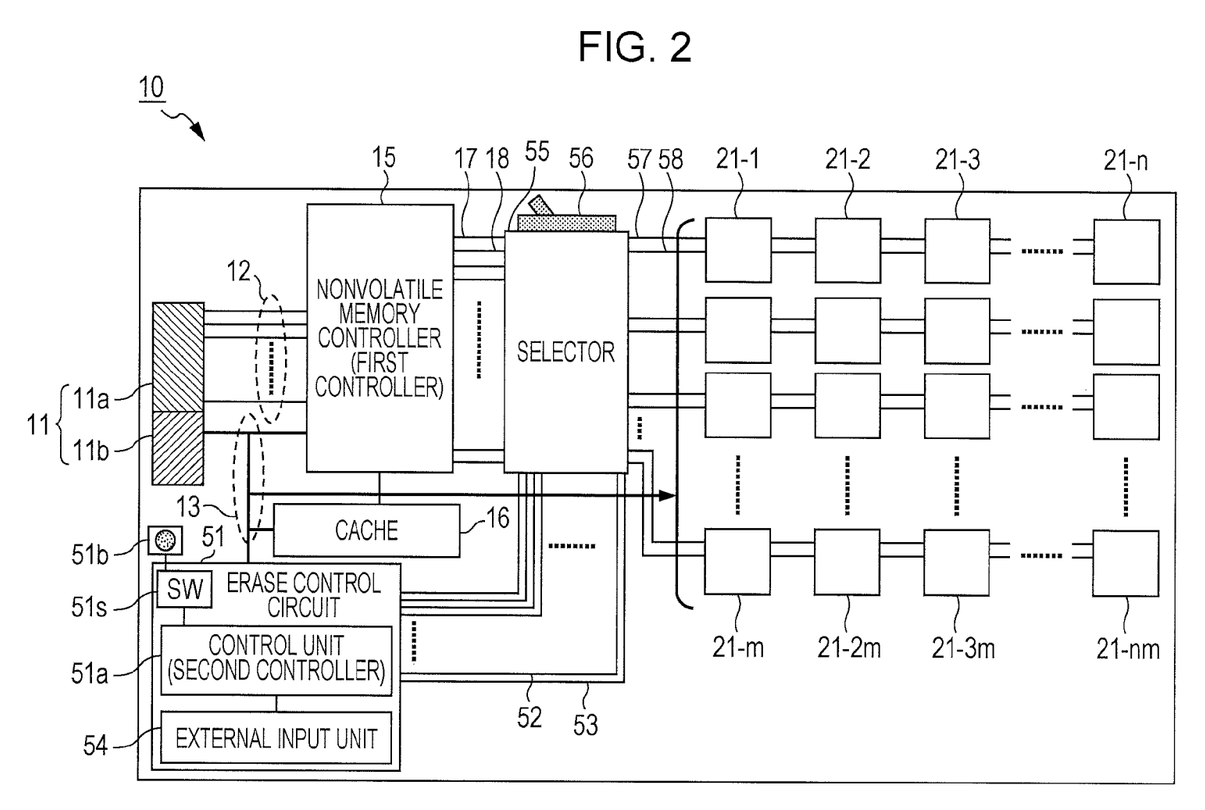
FIG. 2 is a diagram illustrating an example of a configuration of a nonvolatile memory unit according to a first embodiment.

FIG. 2 is a diagram illustrating an example of a configuration of a nonvolatile memory unit according to a first embodiment. In the following, description will be made by assigning the same numerals to the same configurations as those in FIG. 1. The nonvolatile memory unit 1 in FIG. 1 is connected with data erasing equipment via the interface 11 for execution of data erasing.

However, in the case that the nonvolatile memory controller 15, the interface 11 or the like is failed, it may be difficult for the nonvolatile memory controller 15 to receive an erase command from the data erasing equipment so as to process data concerned. Therefore, it may be difficult for the nonvolatile memory controller 15 to control data erasing to be executed on the nonvolatile memories 21-1 to 21-nm.

Thus, a nonvolatile memory unit 10 illustrated in FIG. 2 includes an erase control circuit 51, a selector 55, a DIP switch 56 and the like in addition to the nonvolatile memory controller illustrated in FIG. 1.

The nonvolatile memory controller 15 controls operations such as data recording, data regenerating and data erasing to be executed on the nonvolatile memories 21-1 to 21-nm on the basis of IF commands such as record, regenerate and erase commands output from the interface 11. That is, the nonvolatile memory controller 15 erases data in the nonvolatile memories 21-1 to 21-nm on the basis of the erase command and hence may be given as an example of a first controller.

The erase control circuit 51 includes a control unit 51a and an external input unit 54. The control unit 51a is an example of a second controller that controls data erasing to be executed on the nonvolatile memories in place of the nonvolatile memory controller 15 and outputs an erase control signal for controlling the nonvolatile memories 21-1 to 21-nm to execute data erasing to the nonvolatile memories 21-1 to 21-nm.

Incidentally, the erase control circuit 51 is configured to be operable independently of the nonvolatile memory controller 15 and is used when the nonvolatile memory controller 15, the interface 11 or the like is failed and enters a disabled state or a state in which reception of an erase command is not allowed.

In addition, the erase control circuit 51 is power-fed from the power supply input unit 11b of the interface 11 via the power supply line 13. However, the erase control circuit 51 is not connected with the signal input unit 11a of the interface 11. Thus, a signal for instructing data erasing which is different from the erase command which is input into it via the interface 11 is input into the external input unit 54.

Then, when the signal for instructing data erasing is input, the external input unit 54 outputs an erase instruction signal to the control unit 51a. The control unit 51a is activated triggered by the erase instruction signal and all circuits included in the erase control circuit 51 enter active states. Then, the control unit 51a outputs the erase control signal for executing data erasing to the nonvolatile memories 21-1 to 21-nm on the basis of the erase instruction signal output from the external input unit 54.

Incidentally, the erase control circuit 51 puts only the external input unit 54 on standby and the powers to be supplied to other circuits such as the control unit 51a and the like are turned off until the external input unit 54 outputs the erase instruction signal to the control unit 51a. Owing to the above mentioned configuration, power consumption may be reduced.

At the completion of erasing of all pieces of data, each of the nonvolatile memories 21-1 to 21-nm sends the erase control circuit 51 a control signal indicating completion of data erasing. The erase control circuit 51 detects that erasing of all pieces of data in the nonvolatile memories 21-1 to 21-nm has been completed and notifies the outside of this fact. A lamp may be given as an example of notifying means. The erase control circuit 51 turns a switch 51S of a lamp 51b disposed on the nonvolatile memory unit 10 on to light the lamp.

Characters or letters may be displayed on an electric bulletin board or a sound may be generated using a loudspeaker or the like in place of the lamp. In addition, such a configuration may be allowed that an information output terminal is installed on the nonvolatile memory unit 10 so as to send a control signal indicating completion of data erasing from the erase control circuit 51. Owing to the above mentioned configuration, an operator is allowed to readily recognize that erasing of data in all the nonvolatile memories has been completed.

Next, an example of a configuration of the external input unit 54 will be described. As the external input unit 54, a USB (Universal Serial Bus) interface which is one example of the information input terminal is installed in addition to the interface 11. Then, the external erasing equipment is interface-connected with the nonvolatile memory unit.

The external input unit 54 may be configured to directly receive the erase instruction signal as described above. Incidentally, although an interface terminal other than the USB interface terminal may be used, the USB interface terminal is small-sized and hence is favorably used from a viewpoint of the installation space of the nonvolatile memory unit.

In addition, a DIP switch is installed on the external input unit 54 to control change-over (switch-on) of the switch. Owing to provision of such a switch as mentioned above, the external input unit 54 may be configured to output the erase instruction signal to the control unit 51a which is the second controller.

An example in which the USB interface terminal is installed on the erase control circuit 51 as the external input unit 54 and an example in which the DIP switch is installed on the external input unit 54 have been described. As an alternative, the USB interface terminal or the DIP switch may be disposed at a predetermined position on the nonvolatile memory unit 10 on condition that it is connected with the erase control circuit 51. Incidentally, a position where a user may not erroneously operate it may be preferably set as the predetermined position.

However, it is desirable not to allow the user of the nonvolatile memory unit to readily use a data discarding function for better assurance of data maintainability. Therefore, it may be desirable to use a specific signal which would not be used in normal operation in place of a configuration that the erase instruction signal is directly input into the unit as described above.

Therefore, an erase control circuit which will be described in each of later described embodiments includes a function of outputting the erase instruction signal to the control unit after whether an external signal which has been input into the external input unit is a signal indicating an erase instruction has been judged. Specific manners will be described using second to seventh embodiments.

In addition, the maintainability of data is increased by using a change-over circuit. The selector 55 and the DIP switch 36 are examples of the change-over circuit. When the DIP switch 56 is changed over, the selector 55 switches from connection of the nonvolatile memory controller 15 which is the first controller with each nonvolatile memory to connection of the erase control circuit 51 which is the second controller with each nonvolatile memory.

Therefore, when the connection is not switched, since the erase control circuit 51 is disconnected from the nonvolatile memory even when the erase control circuit 51 outputs an erase control signal, execution of data erasing is not allowed. Thus, data erasing is not executed unless the change-over circuit is operated and hence the data is maintained in safety. That is, erroneous erasing of data caused by an erroneous operation is prevented by using two means, that is, the erase instruction signal and connection switching.

Figure 3:
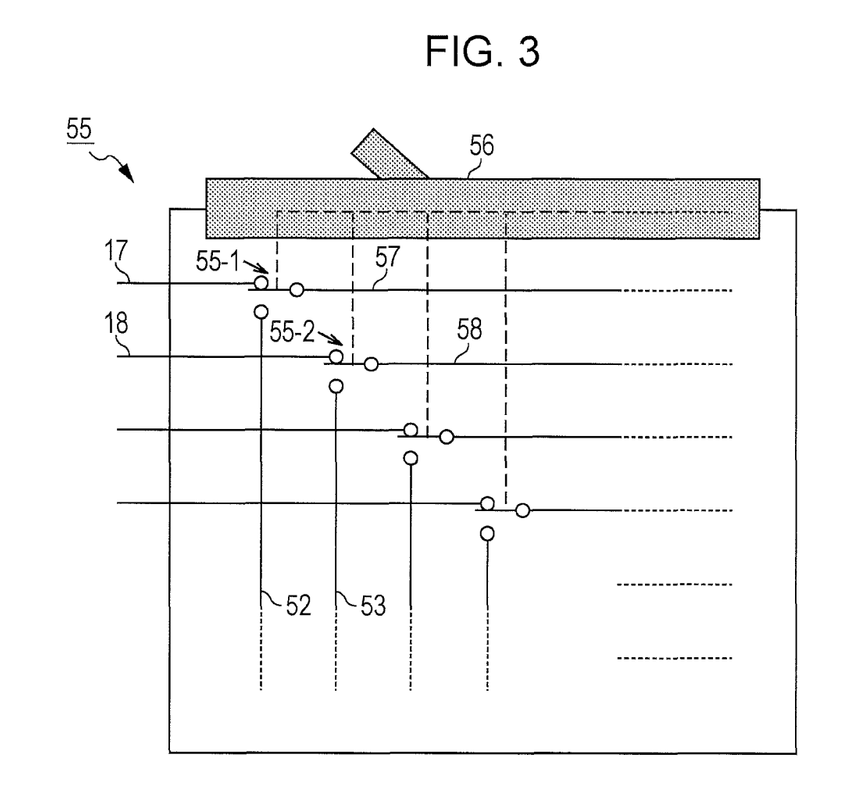
FIG. 3 is a diagram illustrating an example of a configuration of a selector.

FIG. 3 is a diagram illustrating an example of a configuration of a selector. Changing-over of switches 55-1 and 55-2 is performed using the DIP switch 56. When the switch 55-1 is changed over, connection of an I/O bus 17 with an I/O bus 57 is switched to connection of an I/O bus 52 with the I/O bus 57.

When the switch 55-2 is changed over, connection of the control signal line 18 with the control signal line 58 is switched to connection of the control signal line 53 with the control signal line 58. Therefore, it is allowed to switch from connection of the nonvolatile memory controller 15 which is the first controller with each nonvolatile memory to connection of the erase control circuit 51 which is the second controller with each nonvolatile memory or vice versa.

Figure 4:
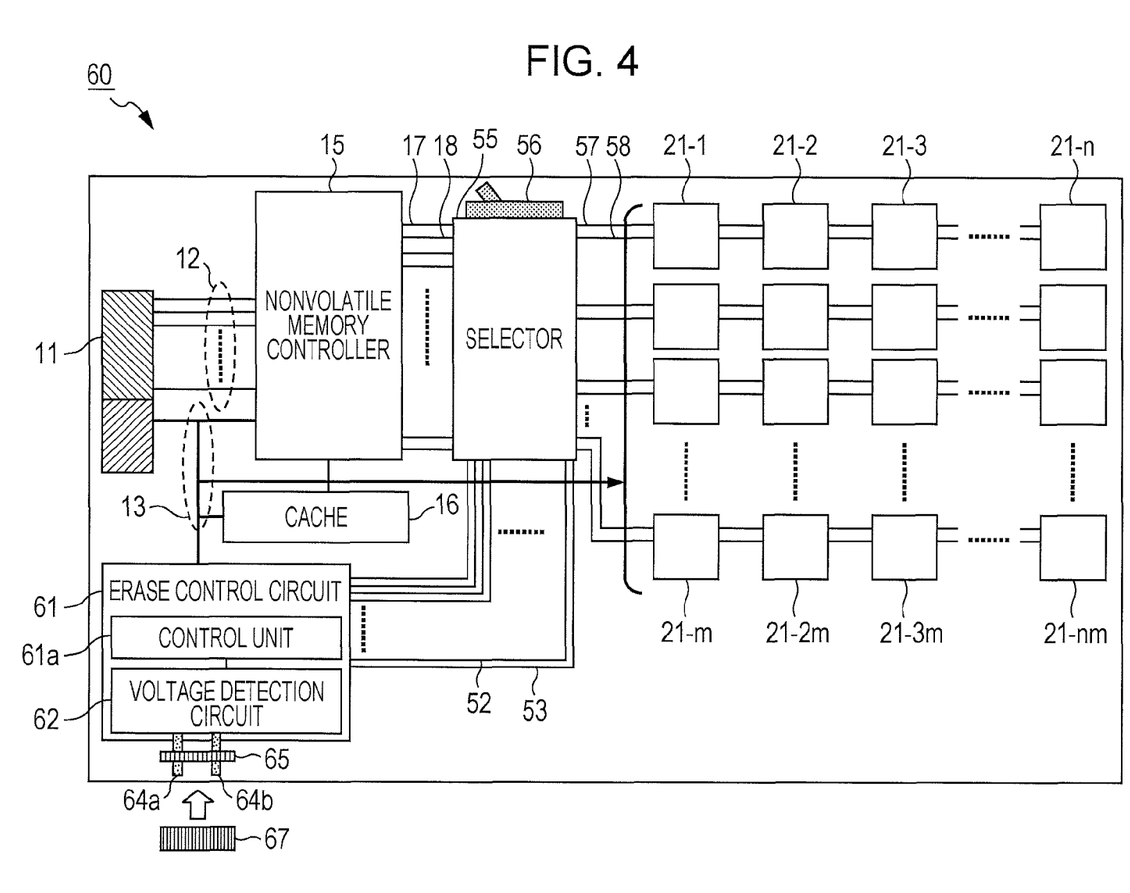
FIG. 4 is a diagram illustrating an example of a configuration of a nonvolatile memory unit according to a second embodiment.

FIG. 4 is a diagram illustrating an example of a configuration of a nonvolatile memory unit according to a second embodiment. In the following, the same numerals are assigned to the same configurations as those in FIG. 1 and FIG. 2 and description thereof will be omitted. In the example illustrated in FIG. 4, a nonvolatile memory unit 60 includes the nonvolatile memory controller 15, an erase control circuit 61, the selector 55, the DIP switch 56 and the like.

The erase control circuit 61 includes a control unit 61*a* and a voltage detection circuit 62. The control unit 61*a* is an example of the second controller that outputs an erase control signal for controlling each nonvolatile memory to execute data erasing in place of the nonvolatile memory controller 15.

The erase control circuit 61 includes the voltage detection circuit 62 which is installed on the erase control circuit 61 and external terminals 64*a* and 64*b* which are connected with the voltage detection circuit 62 as elements included in an external input unit. Incidentally, it is desirable to dispose the external terminals 64*a* and 64*b* at a position where the terminals might not be readily operated by a user, for example, on a circuit board within the nonvolatile memory unit 60.

A jumper block 67 short-circuits a jumper pin 65 which is in contact with the external terminals 64*a* and 64*b*. The voltage detection circuit 62 detects the value of voltage applied across the external terminals 64*a* and 64*b* and compares the detected voltage value with a voltage value which has been previously determined. The previously determined voltage value is a voltage value indicating that a short circuit has occurred across the external terminals 64*a* and 64*b*.

When the detected voltage value coincides with the previously determined voltage value, the voltage detection circuit 62 regards that a short circuit has occurred across the external terminals 64*a* and 64*b* by covering them with the jumper block 67 and outputs an erase instruction signal to the control unit 61*a*. The control unit 61*a* that has received the erase instruction signal is activated and all circuits in the erase control circuit 61 enter active states. Then, the control unit 61*a* prepares the erase control signal.

The erase control signal so prepared as mentioned above is sent to the nonvolatile memories 21-1 to 21-$nm$ when the I/O bus 52 is connected with the I/O bus 57 and the control signal line 53 is connected with the control signal line 58 using the selector 55. Then, data are sequentially erased from within the memories in order in units of rows of the nonvolatile memories 21-1 to 21-$m$, 21-2 to 21-$2m$, . . . and 21-$n$ to 21-$nm$.

As described above, it may become possible to prevent data from being erroneously erased by a user and to readily generate a signal for instructing data erasing by appropriately setting output conditions of the erase instruction signal using tools such as the external terminals, the jumper pin, the jumper block and the like.

Figure 5:
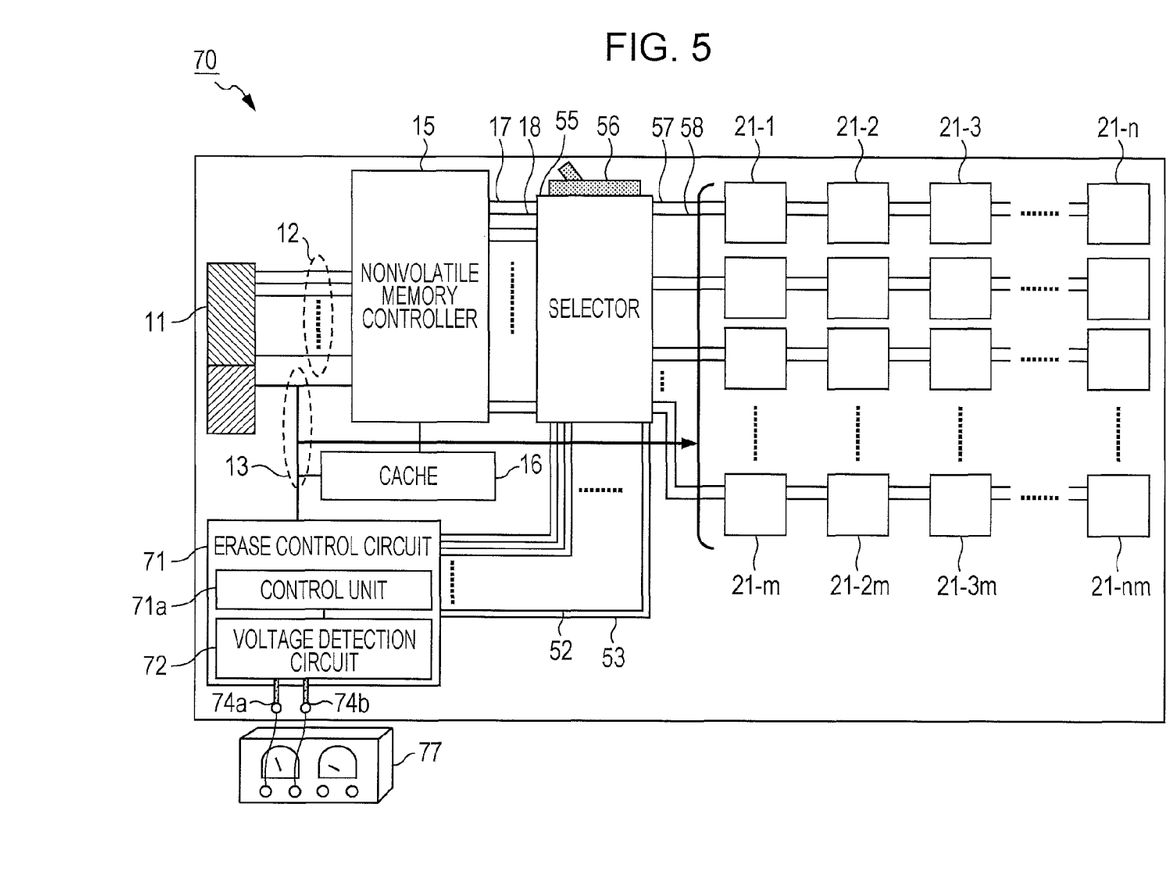
FIG. 5 is a diagram illustrating an example of a configuration of a nonvolatile memory unit according to a third embodiment.

FIG. 5 is a diagram illustrating an example of a configuration of a nonvolatile memory unit according to a third embodiment. In the example illustrated in FIG. 5, a nonvolatile memory unit 70 includes the nonvolatile memory controller 15, an erase control circuit 71, the selector 55, the DIP switch 56 and the like.

The erase control circuit 71 includes a control unit 71*a* and a voltage detection circuit 72. The control unit 71*a* is an example of the second controller that outputs an erase control signal for controlling each nonvolatile memory to execute data erasing in place of the nonvolatile memory controller 15.

The nonvolatile memory unit 70 includes the voltage detection circuit 72 which is installed on the erase control circuit 71 and external terminals 74*a* and 74*b* which are connected with the voltage detection circuit 72 as elements included in an external input unit. Incidentally, it is desirable to dispose the external terminals 74*a* and 74*b* at a position where the terminals might not be readily operated by a user, for example, on a circuit board within the nonvolatile memory unit 70.

A DC stabilization power source 77 is external equipment which is externally connected with the nonvolatile memory unit 70. The external terminals 74*a* and 74*b* are connected with the DC stabilization power source 77 and a previously predetermined voltage is applied across the external terminals.

The voltage detection circuit 72 detects the value of the voltage applied across the external terminals 74*a* and 74*b* and compares the detected voltage value with a previously determined voltage value. A voltage value higher than values 3 to 5 V which are generally used in an electronic device, for example, 6V is set as the previously determined voltage value in order to avoid erroneous detection. The voltage of the above mentioned voltage value is applied from the DC stabilization power source as the external equipment.

When the detected voltage value coincides with the previously determined voltage value, the voltage detection circuit 72 regards that the previously determined voltage has been applied across the external terminals 74a and 74b and outputs an erase instruction signal to the control unit 71a. The control unit 71a that has received the erase instruction signal is activated and all circuits included in the erase control circuit 71 enter active states. Then, the control unit 71a prepares the erase control signal.

The erase control signal so prepared as mentioned above is sent to the nonvolatile memories 21-1 to 21-nm when the I/O bus 52 is connected with the I/O bus 57 and the control signal line 53 is connected with the control signal line 58 using the selector 55. Then, data are sequentially erased from within the memories in order in units of rows of the nonvolatile memories 21-1 to 21-m, 21-2 to 21-2m, . . . and 21-n to 21-nm.

As described above, it may become possible to prevent data from being erroneously erased by a user and to readily generate a signal for instructing data erasing by appropriately setting output conditions of the erase instruction signal using the external terminals and the external equipment which is not owned by the user in general.

Figure 6:
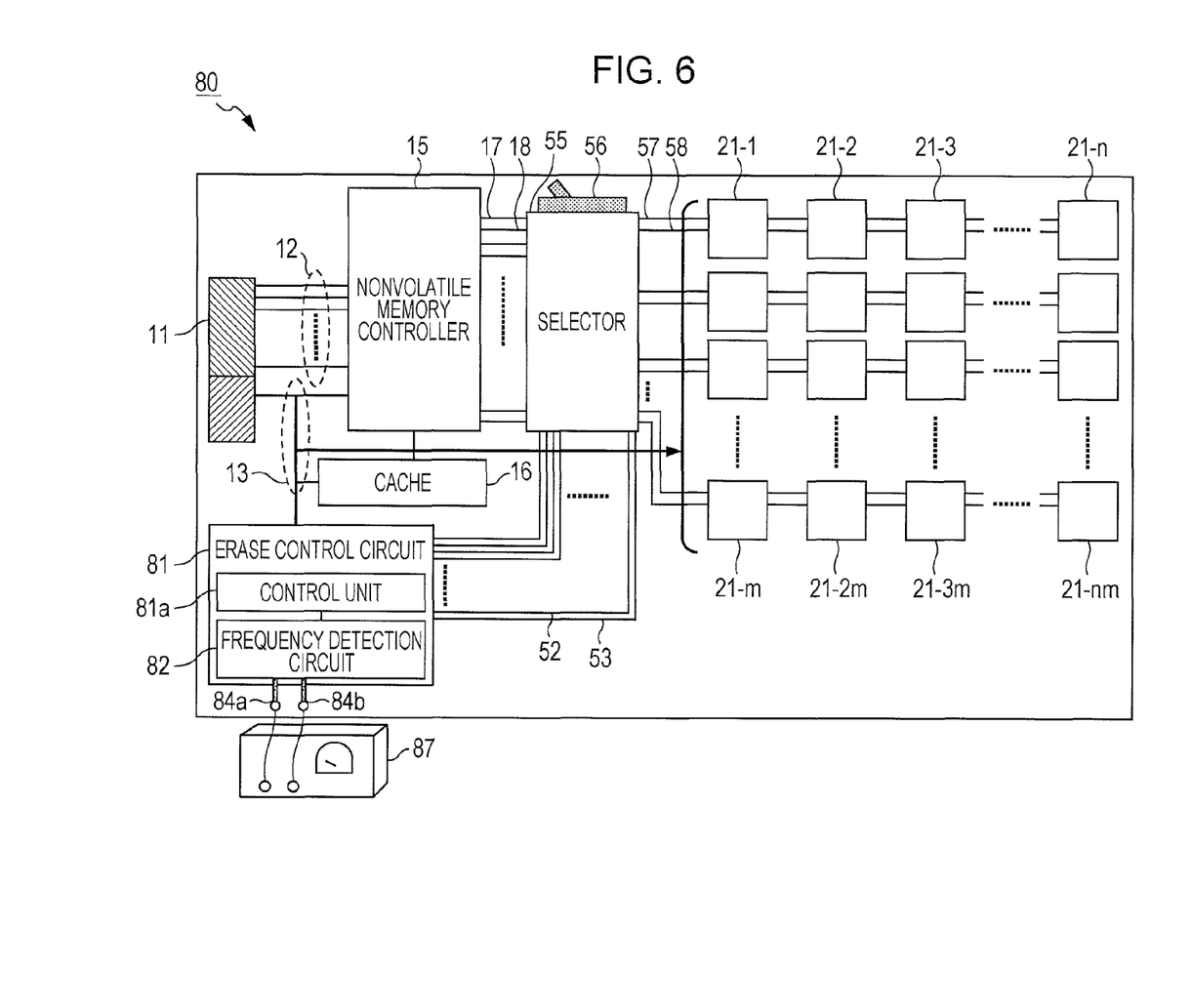
FIG. 6 is a diagram illustrating an example of a configuration of a nonvolatile memory unit according to a fourth embodiment.

FIG. 6 is a diagram illustrating an example of a configuration of a nonvolatile memory unit according to a fourth embodiment. In the example illustrated in FIG. 6, a nonvolatile memory unit 80 includes the nonvolatile memory controller 15, an erase control circuit 81, the selector 55, the DIP switch 56 and the like.

The erase control circuit 81 includes a control unit 81a and a frequency detection circuit 82. The control unit 81a is an example of the second controller that outputs an erase control signal for controlling each nonvolatile memory to execute data erasing in place of the nonvolatile memory controller 15.

The nonvolatile memory unit 80 includes the voltage detection circuit 82 which is installed on the erase control circuit 81 and external terminals 84a and 84b which are connected with the frequency detection circuit 82 as elements included in an external input unit. A pulse generator 87 is external equipment to be connected with the nonvolatile memory unit 80. The pulse generator 87 is connected with the external terminals 84a and 84b to input a signal or clock having a previously determined frequency into the external terminals 84a and 84b.

Incidentally, it is desirable to dispose the external terminals 84a and 84b at a position where the terminals might not be readily operated by a user, for example, on a circuit board within the nonvolatile memory unit 80.

The frequency detection circuit 82 detects the frequency of the signal or clock which has been input into the external terminals 84a and 84b and compares the detected frequency with the previously determined frequency. Incidentally, a specific frequency, for example, a frequency selected from within a range of 20 to 50 Hz is set as the previously determined frequency in order to avoid erroneous detection.

When the detected frequency coincides with the previously determined frequency, the frequency detection circuit 82 regards that the signal or clock having the previously determined frequency has been input from external equipment and outputs an erase instruction signal to the control unit 81a. The control unit 81a that has received the erase instruction signal is activated and all circuits included in the erase control circuit 81 enter active states. Then, the control unit 81a prepares the erase control signal.

The erase control signal so prepared as mentioned above is sent to the nonvolatile memories 21-1 to 21-nm when the I/O bus 52 is connected with the I/O bus 57 and the control signal line 53 is connected with the control signal line 58 using the selector 55. Then, data are sequentially erased from within the memories in order in units of rows of the nonvolatile memories 21-1 to 21-m, 21-2 to 21-2m, . . . and 21-n to 21-nm.

As described above, it may become possible to prevent data from being erroneously erased by a user and to readily generate a signal for instructing data erasing by appropriately setting output conditions of the erase instruction signal using the external terminals and the external equipment which is not owned by the user in general.

Figure 7:
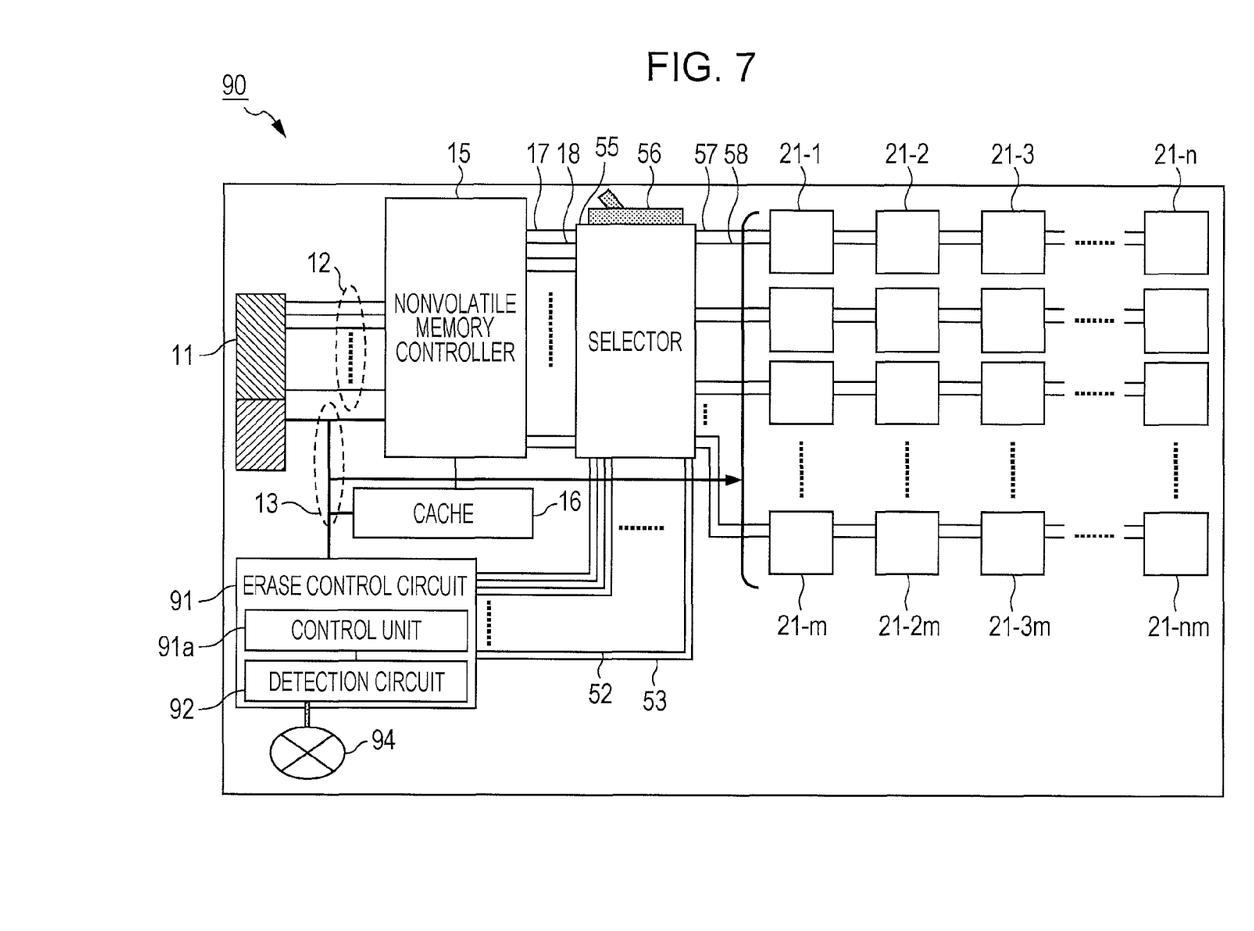
FIG. 7 is a diagram illustrating an example of a configuration of a nonvolatile memory unit according to a fifth embodiment.

FIG. 7 is a diagram illustrating an example of a configuration of a nonvolatile memory unit according to a fifth embodiment. In the example illustrated in FIG. 7, a nonvolatile memory unit 90 includes the nonvolatile memory controller 15, an erase control circuit 91, the selector 55, the DIP switch 56 and the like.

The erase control circuit 91 includes a control unit 91a and a detection circuit 92. The control unit 91a is an example of the second controller that outputs an erase control signal for controlling each nonvolatile memory to execute data erasing in place of the nonvolatile memory controller 15. The nonvolatile memory unit 90 includes the detection circuit 92 which is installed on the erase control circuit 91 and a sensor 94 which is connected with the detection circuit 92 as elements included in an external input unit. Incidentally, it is desirable to dispose the sensor at a position where the sensor might not be readily operated by a user, for example, on a circuit board within the nonvolatile memory unit 90.

The detection circuit 92 detects an output from the sensor 94 and outputs an erase instruction signal to the control unit 91a on the basis of the output from the sensor. The control unit 91a that has received the erase instruction signal is activated and all circuits included in the erase control circuit 91 enter active states. Then, the control unit 91a prepares the erase control signal.

The erase control signal so prepared as mentioned above is sent to the nonvolatile memories 21-1 to 21-nm when the I/O bus 52 is connected with the I/O bus 57 and the control signal line 53 is connected with the control signal line 58 using the selector 55. Then, data are sequentially erased from within the memories in order in units of rows of the nonvolatile memories 21-1 to 21-m, 21-2 to 21-2m, . . . and 21-n to 21-nm.

Here, as examples of the sensor 94, a light sensor, a temperature sensor, a pressure sensor, an acceleration sensor and the like may be given. In the case that the light sensor is used, a light quantity detection circuit is used as the detection circuit 92. Then, the light sensor is light-shielded in advance with a tape or the like and detects light by peeling off the tape.

The light quantity detection circuit detects the quantity of light that the light sensor has sensed and detects whether the quantity of light that the light sensor has sensed is larger than a previously determined light quantity. Incidentally, since a change in light shielding state needs only be found, a considerably small light quantity may be set as the previously determined light quantity.

In the case that the detected light quantity is larger than the previously determined light quantity, the light quantity detection circuit regards that the tape or the like has been peeled off and outputs an erase instruction signal to the control unit 91a. The control unit 91a that has received the erase instruction signal is activated and all circuits included in the erase control circuit 91 enter active states. Then, the control unit 91a prepares the erase control signal.

Accordingly, it may become possible to readily control output of the erase instruction signal without external equipment by using the light sensor and the light-shielding tape or seal.

In addition, in the case that temperature sensor is used, a temperature detection circuit is used as the detection circuit 92. Then, the temperature sensor senses hot air given from a spot heater or cold air given from a spot cooler.

The temperature detection circuit detects the temperature that the temperature sensor has sensed and detects whether the temperature that the temperature sensor has sensed is higher than a previously determined temperature (when the heater is used) or lower than a previously determined temperature (when the cooler is uses). Incidentally, specific temperatures which are different from a natural environmental temperature or a device temperature, for example, −20° C. and 85° C. may be set as the previously determined temperatures in order to avoid erroneous detection.

The temperature detection circuit that has detected that the sensed temperature is higher than the previously determined temperature or is lower than the previously determined temperature regards that the specific temperature has been given to the temperature sensor and outputs an erase instruction signal to the control unit 91*a*. The control unit 91*a* that has received the erase instruction signal is activated and all circuits included in the erase control circuit 91 enter active states. Then, the control unit 91*a* prepares the erase control signal.

Accordingly, it may become possible to readily control output of the erase instruction signal by using the temperature sensor and simple external equipment (the heater or the cooler).

In addition, in the case that the pressure sensor is used, a pressure detection circuit is used as the detection circuit 92. The pressure sensor senses a pressure when a finger, a screwdriver or the like is strongly pushed against it.

The pressure detection circuit detects the pressure that the pressure sensor has sensed and detects whether the pressure that the pressure sensor has sensed is larger than a previously determined pressure. The pressure detection circuit that has detected that the sensed pressure is larger than the previously determined pressure outputs an erase instruction signal to the control unit 91*a*. The control unit 91*a* that has received the erase instruction signal is activated and all circuits included in the erase control circuit 91 enter active states. Then, the control unit 91*a* prepares the erase control signal.

Therefore, it may become possible to readily control output of the erase instruction signal by using the pressure sensor with no use of external equipment.

In the case that the acceleration sensor is used, an acceleration detection circuit is used as the detection circuit 92. Then, the acceleration sensor senses the acceleration obtained when the nonvolatile memory unit 90 is vibrated in a previously determined direction such as a vertical direction, a lateral direction or a longitudinal direction. The nonvolatile memory unit 90 may be vibrated in the previously determined direction by generating vibration using a vibration generating device or shaking the nonvolatile memory unit by hand.

The acceleration detection circuit detects the acceleration that the acceleration sensor has sensed and detects whether the acceleration that the acceleration sensor has sensed is higher than a previously determined acceleration. Incidentally, an acceleration which may not be detected in normal use of the unit is set as the previously determined acceleration in order to avoid erroneous detection.

The acceleration detection circuit that has detected that the sensed acceleration is higher than the previously determined acceleration outputs an erase instruction signal to the control unit 91*a*. The control unit 91*a* that has received the erase instruction signal is activated and all circuits included in the erase control circuit 91 enter active states. Then, the control unit 91*a* prepares the erase control signal.

Accordingly, it may become possible to readily control output of the erase instruction signal by sensing a specific acceleration using the acceleration sensor.

The erase control signal so prepared as mentioned above is sent to the nonvolatile memories 21-1 to 21-*nm* when the I/O bus 52 is connected with the I/O bus 57 and the control signal line 53 is connected with the control signal line 58 using the selector 55. Then, data are sequentially erased from within the memories in order in units of rows of the nonvolatile memories 21-1 to 21-*m*, 21-2 to 21-2*m*, . . . and 21-*n* to 21-*nm*.

As described above, it may become possible to prevent data from being erroneously erased by a user and to readily generate a signal for instructing data erasing by using various sensors and appropriately setting output conditions of the erase instruction signal.

Figure 8:
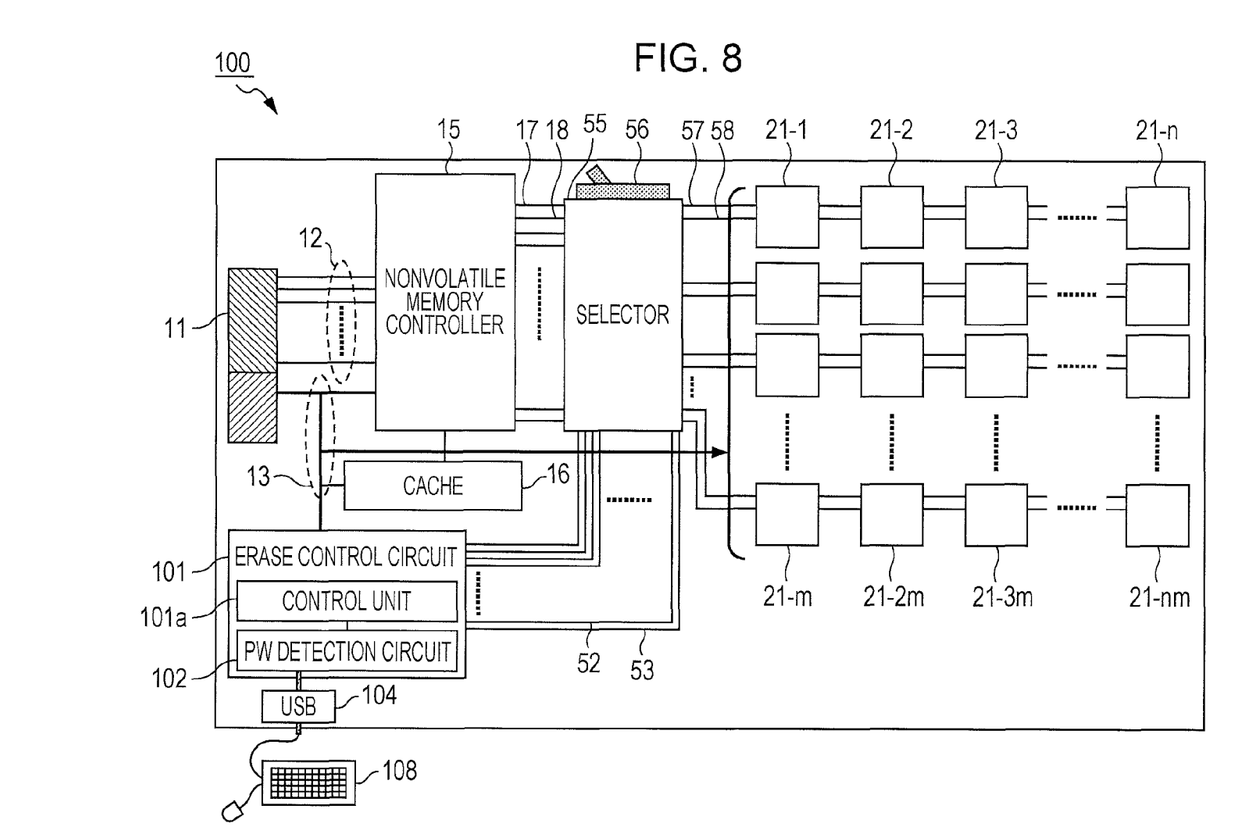
FIG. 8 is a diagram illustrating an example of a configuration of a nonvolatile memory unit according to a sixth embodiment.

FIG. 8 is a diagram illustrating an example of a configuration of a nonvolatile memory unit according to a sixth embodiment. In the example illustrated in FIG. 8, a nonvolatile memory unit 100 includes the nonvolatile memory controller 15, an erase control circuit 101, the selector 55, the DIP switch 56 and the like.

The erase control circuit 101 includes a control unit 101*a* and a password (PW) detection circuit 102. The control unit 101*a* is an example of the second controller that outputs an erase control signal for controlling each nonvolatile memory to execute data erasing in place of the nonvolatile memory controller 15.

The nonvolatile memory unit 100 includes the PW detection circuit 102 which is installed on the erase control circuit 101 and a USB interface terminal 104 which is connected with the PW detection circuit 102 as elements included in an external input unit. Incidentally, although any information input terminal other than the USB interface terminal may be adopted, the USB interface terminal is small-sized and hence may be favorable from the viewpoint of the installation space of the nonvolatile memory unit.

Information input equipment 108 such as a keyboard, a mouse and others is connected with the USB interface terminal 104 in order to erase data in the nonvolatile memories. Incidentally, it is desirable to dispose the USB interface terminal 104 at a position where the terminal might not be readily operated by a user, for example, on a circuit board within the nonvolatile memory unit 100.

The PW detection circuit 102 detects a control signal for instructing data erasing and password information which are input from the USB interface terminal 104. The PW detection circuit 102 compares the detected password information with a comparative password. Incidentally, the comparative password is registered in advance into a memory included in the erase control circuit 101, the PW detection circuit 102 or the like.

When the detected password information coincides with the comparative password, the PW detection circuit 102 outputs an erase instruction signal to the control unit 101*a*. The control unit 101*a* that has received the erase instruction signal is activated and all circuits included in the erase control circuit 101 enter active states. Then, the control unit 101*a* prepares the erase control signal.

The erase control signal so prepared as mentioned above is sent to the nonvolatile memories 21-1 to 21-*nm* when the I/O bus 52 is connected with the I/O bus 57 and the control signal line 53 is connected with the control signal line 58 using the selector 55. Then, data are sequentially erased from within the memories in order in units of rows of the nonvolatile memories 21-1 to 21-*m*, 21-2 to 21-2*m*, . . . and 21-*n* to 21-*nm*.

As described above, it may become possible to prevent data from being erroneously erased by a user and to readily generate a signal for instructing data erasing by setting the password information that the user is not allowed to readily find out.

Figure 9:
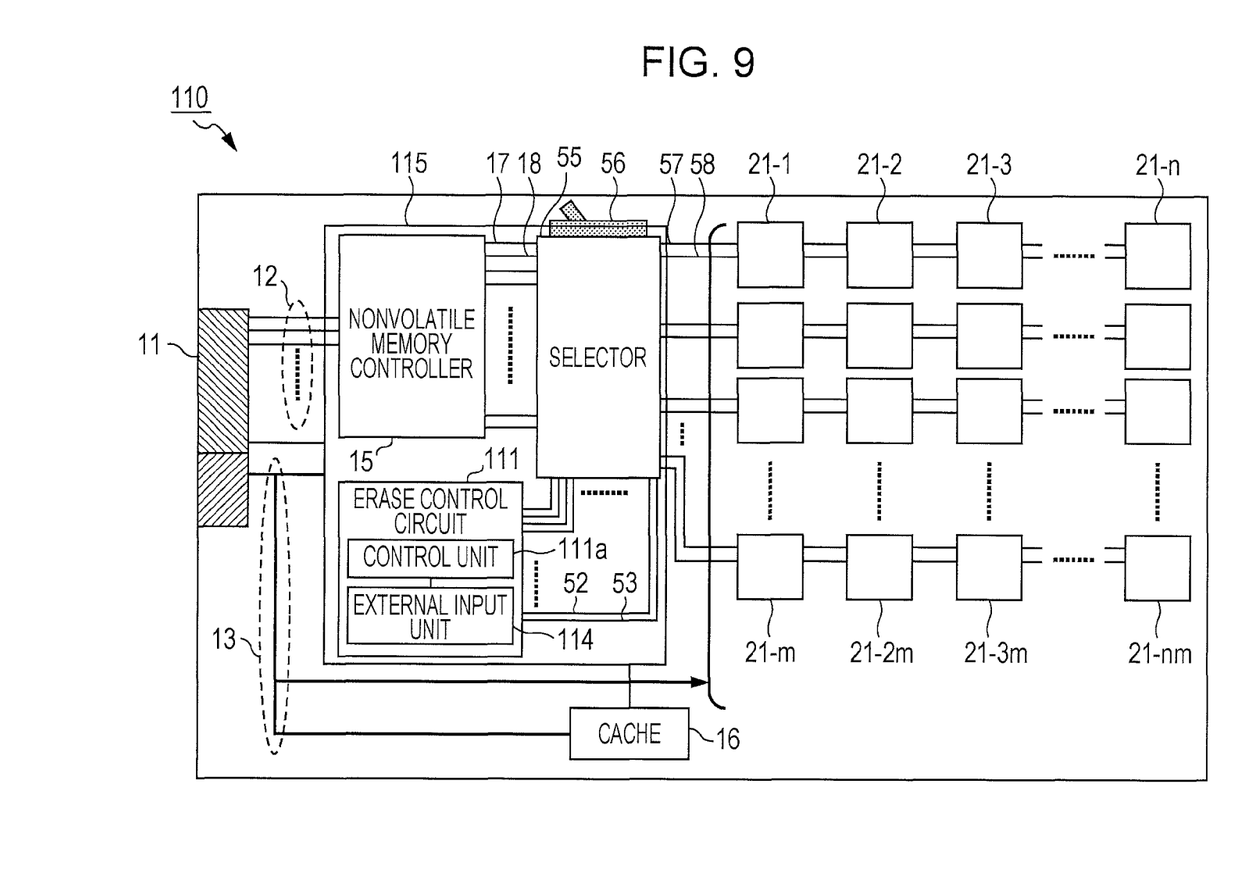
FIG. 9 is a diagram illustrating an example of a configuration of a nonvolatile memory unit according to a seventh embodiment.

FIG. 9 is a diagram illustrating an example of a configuration of a nonvolatile memory unit according to a seven embodiment. A nonvolatile memory unit 110 illustrated in FIG. 9 includes a controller unit 115 and the like. The controller unit 115 includes an erase control circuit 111 including the nonvolatile memory controller 15 and a control unit 111a, the selector 55 and the DIP switch 56 and is configured as an integrated circuit. That is, the nonvolatile memory controller 15 which is an example of the first controller and the control unit 111a which is an example of the second controller are incorporated into one controller unit.

The nonvolatile memory controller 15 and the erase control circuit 111 are configured to be operable independently of each other in the controller unit 115. Therefore, the erase control circuit 111 is incorporated into the controller unit 111 as an independent control circuit which is not influenced by a failure that has been occurred in the nonvolatile memory controller 15.

Incidentally, one of the erase control circuits 51, 61, 71, 81, 91 and 101 that have been described in the above embodiments may be adopted as the erase control circuit 111. In addition, an external terminal and a sensor which are parts of an external input unit may be disposed at other positions without incorporating into the controller unit 111.

Therefore, it may become possible to reduce the mounting space of the nonvolatile memory unit and to reduce the assembling man-hour by integrating together the circuits as the controller unit 115.

In addition, although description is omitted in the explanation of the nonvolatile memory units according to the second to seventh embodiments, notifying means for notifying the outside of the fact that erasing of data in all the nonvolatile memories 21-1 to 21-nm has been completed may be installed in the nonvolatile memory units 60, 70, 80, 90, 100 and 110 as in the nonvolatile memory unit 10 according to the first embodiment.

Specifically, when erasing of all pieces of data has been completed, each of the nonvolatile memories 21-1 to 21-nm sends the erase control circuit a control signal indicating completion of data erasing. The erase control circuit detects completion of erasing of data in all the nonvolatile memories 21-1 to 21-nm and notifies the outside of this fact. As the notifying means, a lamp may be lit, characters or letters may be displayed on an electric bulletin board, and a sound may be generated using a loudspeaker or the like. In addition, such a configuration may be allowed that an information output terminal is installed on the nonvolatile memory unit such that the erase control circuit transmits a control signal indicating completion of data erasing.

In the case that a USB terminal is to be utilized as the external input unit, such a configuration may be adopted that the erase control circuit transmits the control signal indicating completion of data erasing by utilizing the USB terminal as the information output terminal. Then, the external equipment that has received the control signal is allowed to display information indicating completion of data erasing, for example, on a display unit. Therefore, it may become possible for an operator to readily recognize completion of erasing of data in all the nonvolatile memories.

The nonvolatile memory units disclosed herein allow erasing of data in the nonvolatile memories by utilizing the erase instruction signal in place of an erase command, thereby preventing data from being leaked.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A nonvolatile memory unit comprising:
   a nonvolatile memory;
   an interface that at least receives an erase command signal for the nonvolatile memory;
   a first controller that controls to access the nonvolatile memory, and to erase, based on the erase command signal output from the interface, data stored in the nonvolatile memory;
   an external input unit which is arranged independently of the interface;
   a second controller that controls to erase, based on an erase instruction signal output from the external input unit, data stored in the nonvolatile memory; and
   a change-over circuit that switches between connection of the first controller with the nonvolatile memory and connection of the second controller with the nonvolatile memory,
   wherein the second controller controls to erase the data in accordance with the erase instruction signal independently of the first controller when one of the first controller and the interface enters one of a disabled state and a state in which reception of the erase command signal is not allowed.

2. The nonvolatile memory unit according to claim 1, wherein
   the external input unit includes an external terminal and a voltage detection circuit that detects a value of voltage applied across the external terminal,
   the voltage detection circuit outputs the erase instruction signal to the second controller when the detected voltage value coincides with a previously determined voltage value, and
   the second controller outputs an erase control signal for controlling the nonvolatile memory to execute data erasing on the basis of the erase instruction signal to the nonvolatile memory.

3. The nonvolatile memory unit according to claim 2, wherein
   the previously determined voltage value is a voltage value indicating that the external terminal has been short-circuited or a value of a previously determined voltage applied from external equipment.

4. The nonvolatile memory unit according to claim 1, wherein
   the external input unit includes an external terminal and a frequency detection circuit that detects the frequency of a signal or clock which has been input into the external terminal,
   the frequency detection circuit outputs the erase instruction signal to the second controller when the frequency of the input signal or clock coincides with a previously determined frequency, and the second controller outputs an erase control signal for controlling the nonvolatile memory to execute data erasing on the basis of the erase instruction signal to the nonvolatile memory.

5. A nonvolatile memory unit comprising:
a nonvolatile memory;
an interface that at least receives an erase command signal for the nonvolatile memory;
a first controller that controls to erase data stored in the nonvolatile memory on the basis of the erase command signal output from the interface;
an external input unit which is arranged independently of the interface;
a second controller that controls to erase data stored in the nonvolatile memory on the basis of an erase instruction signal output from the external input unit; and
a change-over circuit that switches between connection of the first controller with the nonvolatile memory and connection of the second controller with the nonvolatile memory, wherein
the external input unit includes a sensor and a detection circuit that detects an output from the sensor,
the detection circuit outputs the erase instruction signal to the second controller on the basis of the output from the sensor, and
the second controller outputs an erase control signal for controlling the nonvolatile memory to execute data erasing on the basis of the erase instruction signal to the nonvolatile memory.

6. The nonvolatile memory unit according to claim 5, wherein
the sensor is a light sensor and the detection circuit is a light quantity detection circuit, and
the light quantity detection circuit that has detected that the quantity of light sensed using the light sensor is larger than a previously determined light quantity outputs the erase control signal to the second controller.

7. The nonvolatile memory unit according to claim 6, wherein
the light sensor is covered with a light-shielding seal and the previously determined light quantity is set on the basis of the quantity of light that the light sensor senses when the light-shielding seal has been peeled off.

8. The nonvolatile memory unit according to claim 5, wherein
the sensor is a temperature sensor and the detection circuit is a temperature detection circuit, and
the temperature detection circuit that has detected that the temperature sensed using the temperature sensor is higher than a previously determined temperature or is lower than a previously determined temperature outputs the erase instruction signal to the second controller.

9. The nonvolatile memory unit according to claim 5, wherein
the sensor is a pressure sensor and the detection circuit is a pressure detection circuit, and
the pressure detection circuit that has detected that the pressure sensed using the pressure sensor is larger than a previously determined pressure outputs the erase control signal to the second controller.

10. The nonvolatile memory unit according to claim 5, wherein
the sensor is an acceleration sensor and the detection circuit is an acceleration detection circuit, and
the acceleration detection circuit that has detected that the acceleration sensed using the acceleration sensor is higher than a previously determined acceleration outputs the erase control signal to the second controller.

11. The nonvolatile memory unit according to claim 1, wherein
the external input unit includes an information input terminal into which password information is input and a password detection circuit that compares the password information with comparative password information,
the password detection circuit that has detected that the password information coincides with the comparative password information outputs the erase instruction signal to the second controller, and
the second controller outputs an erase control signal for controlling the nonvolatile memory to execute data erasing on the basis of the erase instruction signal to the nonvolatile memory.

12. The nonvolatile memory unit according to claim 1, wherein
the external input unit includes an information input terminal into which the erase instruction signal is input and outputs the erase instruction signal to the second controller, and
the second controller outputs an erase control signal for controlling the nonvolatile memory to execute data erasing on the basis of the erase instruction signal to the nonvolatile memory.

13. The nonvolatile memory unit according to claim 1, wherein
the external input unit includes a change-over circuit that outputs the erase instruction signal to the second controller, and the second controller outputs an erase control signal for controlling the nonvolatile memory to execute data erasing on the basis of the erase instruction signal which is output under the control of the change-over circuit to a nonvolatile memory.

14. The nonvolatile memory unit according to claim 1, wherein
the second controller that has received an erase instruction signal from the external input unit is activated.

15. The nonvolatile memory unit according to claim 1, wherein
the nonvolatile memory unit further includes a controller unit and the controller unit includes the first controller, the second controller and the change-over circuit.

16. A nonvolatile memory unit comprising:
a nonvolatile memory;
an interface that at least receives an erase command signal for the nonvolatile memory;
a first controller that controls to access the nonvolatile memory, and to erase, based on the erase command signal output from the interface, data stored in the nonvolatile memory;
an external input unit which is arranged independently of the interface;
a second controller that controls to erase, based on an erase instruction signal output from the external input unit, data stored in the nonvolatile memory; and
a change-over circuit that switches between connection of the first controller with the nonvolatile memory and connection of the second controller with the nonvolatile memory,
wherein the external input unit includes an external terminal and a frequency detection circuit that detects the frequency of a signal or clock which has been input into the external terminal, the frequency detection circuit outputs the erase instruction signal to the second controller when the frequency of the input signal or clock coincides with a previously determined frequency, and the second controller outputs an erase control signal for controlling the nonvolatile memory to execute data erasing on the basis of the erase instruction signal to the nonvolatile memory.

* * * * *